United States Patent
Huang et al.

(10) Patent No.: US 11,575,189 B1
(45) Date of Patent: Feb. 7, 2023

(54) MULTI-LAYER BANDPASS FILTER

(71) Applicant: Hong Kong Applied Science And Technology Research Institute Co., Ltd., Shatin (HK)

(72) Inventors: Xiaolong Huang, Shenzhen (CN); Yujiang Wu, Kowloon (HK); Yuxian Zhang, New Territories (HK); Eric Kong Chau Tsang, Kowloon (HK)

(73) Assignee: Hong Kong Applied Science And Technology Research Institute Co., Ltd, Shatin (HK)

( * ) Notice: Subject to any disclaimer, the term of this patent is extended or adjusted under 35 U.S.C. 154(b) by 0 days.

(21) Appl. No.: 17/482,831

(22) Filed: Sep. 23, 2021

(51) Int. Cl.
| | | |
|---|---|---|
| *H01P 1/203* | (2006.01) | |
| *H01P 7/08* | (2006.01) | |
| *H03H 7/01* | (2006.01) | |
| *H03H 1/00* | (2006.01) | |

(52) U.S. Cl.
CPC ...... *H01P 1/20345* (2013.01); *H01P 1/20309* (2013.01); *H01P 7/08* (2013.01); *H03H 7/0161* (2013.01); *H03H 2001/0085* (2013.01)

(58) Field of Classification Search
CPC .. H01P 1/20336; H01P 1/20327; H01P 1/203; H01P 1/20309; H01P 1/20345; H01P 7/08
USPC ................................................. 333/204, 205
See application file for complete search history.

(56) References Cited

U.S. PATENT DOCUMENTS

| | | | |
|---|---|---|---|
| 8,674,791 B2 | 3/2014 | Fukunaga | |
| 9,124,237 B2 | 9/2015 | Sasaki | |
| 9,673,771 B2 | 6/2017 | Nosaka | |
| 10,432,161 B2 | 10/2019 | Ashida et al. | |
| 10,749,234 B2 | 8/2020 | Ashida et al. | |
| 10,784,551 B2 | 9/2020 | Ashida et al. | |
| 2012/0249264 A1 | 10/2012 | Wakata et al. | |
| 2020/0067497 A1* | 2/2020 | Frounchi | H03K 5/13 |
| 2020/0106148 A1 | 4/2020 | Ashida et al. | |
| 2020/0303798 A1 | 9/2020 | Ashida et al. | |

FOREIGN PATENT DOCUMENTS

| | | |
|---|---|---|
| CN | 203690454 U | 2/2014 |
| CN | 110011006 A | 7/2019 |
| CN | 112242597 A | 12/2020 |
| CN | 112164846 A | 1/2021 |
| WO | 2020179046 A1 | 9/2020 |

* cited by examiner

*Primary Examiner* — Rakesh B Patel
(74) *Attorney, Agent, or Firm* — GableGotwals

(57) ABSTRACT

Described is a bandpass filter comprising a multi-layered body, a first resonator conductor formed on a first layer of the body and a second resonator conductor formed on a second, tower layer of the body. The first resonator conductor and the second resonator conductor comprise a first coupling area formed by only a partial overlap of the first resonator conductor and the second resonator conductor. A length of each said resonator conductor is in the range of $\lambda_g/3$ to $\lambda_g/5$, where $\lambda_g$. is a center wavelength of the bandpass filter passband.

19 Claims, 16 Drawing Sheets

MULTI-LAYER BANDPASS FILTER

FIELD OF THE INVENTION

The invention relates generally to a multi-layer bandpass filter and particularly, but not exclusively, to a millimeter-wave multi-layer bandpass filter for use in 5G communication applications.

BACKGROUND OF THE INVENTION 5G communication applications use millimeter-wave frequencies to enable large quantities of spectrum to fulfil a data rate as much as 1000 times higher than 4G communication applications. Massive Multi-input Multi-output (MIMO) techniques are used to extend the coverage and increase frequency spectrum efficiency. In millimeter-wave massive NEMO devices and apparatuses, one antenna typically corresponds to one or two filters. As the number of antennas in the system increases, the number of the filters required increases proportionally. Therefore, the size of a bandpass filter is critical for any practical 5G products having a large number of antennas.

A radio frequency (RF) electronic component such as a filter is designed to pass frequency in a certain range and reject frequencies outside said range. Nowadays, RF front-end technology is developing towards integration which requires compact arrangement of components so there is a considerable desire for increased miniaturization of components and devices. To mitigate the effects of electromagnetic radiation leaking to the surroundings, some bandpass filters are configured so that the plurality of the filter resonators are surrounded by a shield. Filters should at least be designed with a good shielding effect, among other things.

U.S. Ser. No. 10/432,161B2 describes a chip-type multi-stage filter with each resonator conductor on the same layer.

U.S. Ser. No. 10/749,234B2, U.S. Ser. No. 10/784,551B, US2020/0106148A1 and US2020/0303798A1 each describes a bandpass filter using half-wavelength resonators.

U.S. Pat. No. 8,674,791B describes a signal transmission device having resonators provided on spaced-apart substrates.

CN112242597A describes a band-pass filter based on a multi-layer PCB structure with fully over-lapping resonator conductors.

What is desired is an improved passband filter which preferably provides high performance including low insertion loss, compact size, and good shielding.

OBJECTS OF THE INVENTION

An object of the invention is to mitigate or obviate to some degree One or more problems associated with known passband filters.

The above object is met by the combination of features of the main claims; the sub-claims disclose further advantageous embodiments of the invention.

Another object of the invention is to provide an improved passband filter.

One skilled in the art will derive from the following description other objects of the invention, Therefore, the foregoing statements of object are not exhaustive and serve merely to illustrate some of the many objects of the present invention.

SUMMARY OF THE INVENTION

The invention concerns a bandpass filter and devices and apparatuses which include such filters.

In a first main aspect, the invention provides a bandpass filter comprising a multi-layered body, a first resonator conductor formed on a first layer of the body and a second resonator conductor formed on a second, lower layer of the body. The first resonator conductor and the second resonator conductor comprise a first coupling area formed by only a partial overlap of the first resonator conductor and the second resonator conductor. A length of each said resonator conductor is in the range of $\lambda_g/3$ to $\lambda_g/5$, where $\lambda_g$ is a center wavelength of the bandpass filter passband.

In a second main aspect, the invention provides a radio frequency (RI) front-end system for a communications apparatus including a bandpass filter according to the first main aspect of the invention.

In a third main aspect, the invention provides a method for forming a bandpass filter having a multi-layered body, the method comprising the steps of: forming a first resonator conductor on a first layer of the multi-layered body; forming a second resonator conductor on a second, lower layer of the multi-layered body such that the first resonator conductor and the second resonator conductor have a first coupling area comprising a partial overlap of the first resonator conductor and the second resonator conductor, and such that a length of each said resonator conductor is in the range of $\lambda_g/3$ to $\lambda_g/5$, where $\lambda_g$ is a center wavelength of the bandpass filter passband.

The summary of the invention does not necessarily disclose all the features essential for defining the invention; the invention may reside in a sub-combination of the disclosed features.

The forgoing has outlined fairly broadly the features of the present invention in order that the detailed description of the invention which follows may be better understood. Additional features and advantages of the invention will be described hereinafter which form the subject of the claims of the invention. It will be appreciated by those skilled in the art that the conception and specific embodiment disclosed may be readily utilized as a basis for modifying or designing other structures for carrying out the same purposes of the invention.

BRIEF DESCRIPTION OF THE DRAWINGS

The foregoing and further features of the present invention will be apparent from the following description of preferred embodiments which are provided by way of example only in connection with the accompanying figures, of which.

DESCRIPTION OF PREFERRED EMBODIMENTS

The following description is of preferred embodiments by way of example only and without limitation to the combination of features necessary for carrying, the invention into effect.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments, but not other embodiments.

The present description illustrates the principles of the present invention. It will thus be appreciated that those skilled in the art will be able to devise various arrangements that, although not explicitly described or shown herein, embody the principles of the invention and are included within its spirit and scope.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of systems and devices embodying the principles of the invention.

Figure 1:
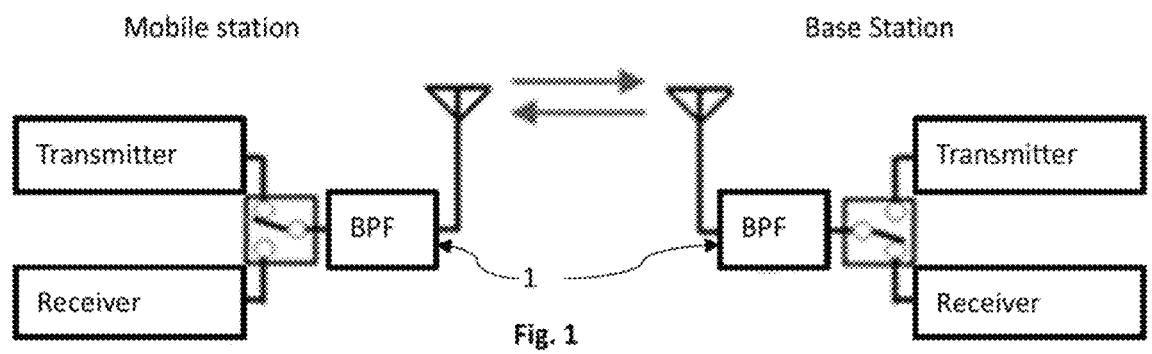
FIG. 1 is a schematic block diagram showing an example of bandpass filters (BPFs) in a communications system.
Figure 2:
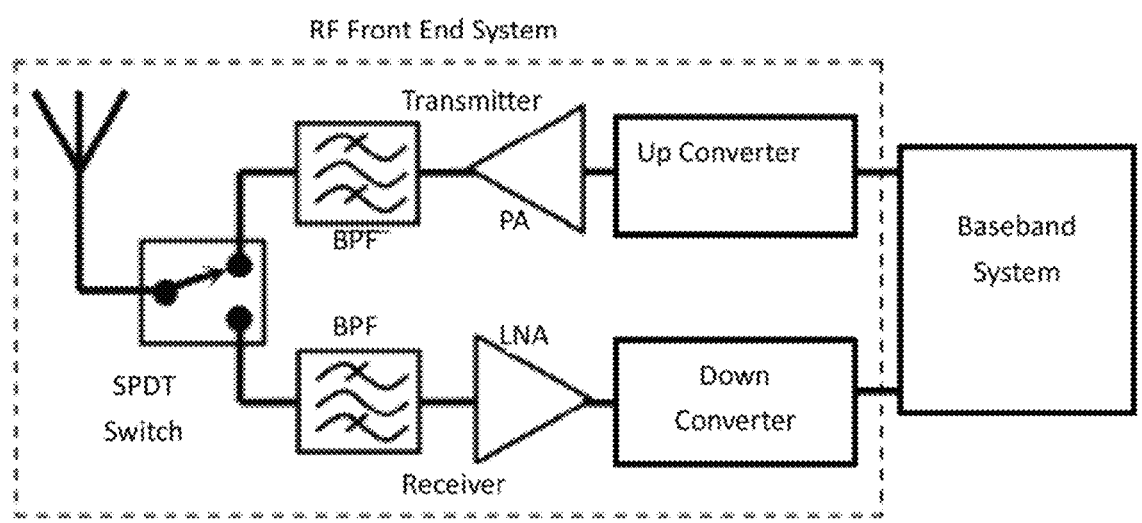
FIG. 2 is a schematic block diagram showing an example of bandpass filters (BPFs) in a radio frequency (RE) front-end system for a communications apparatus.
Figure 3:
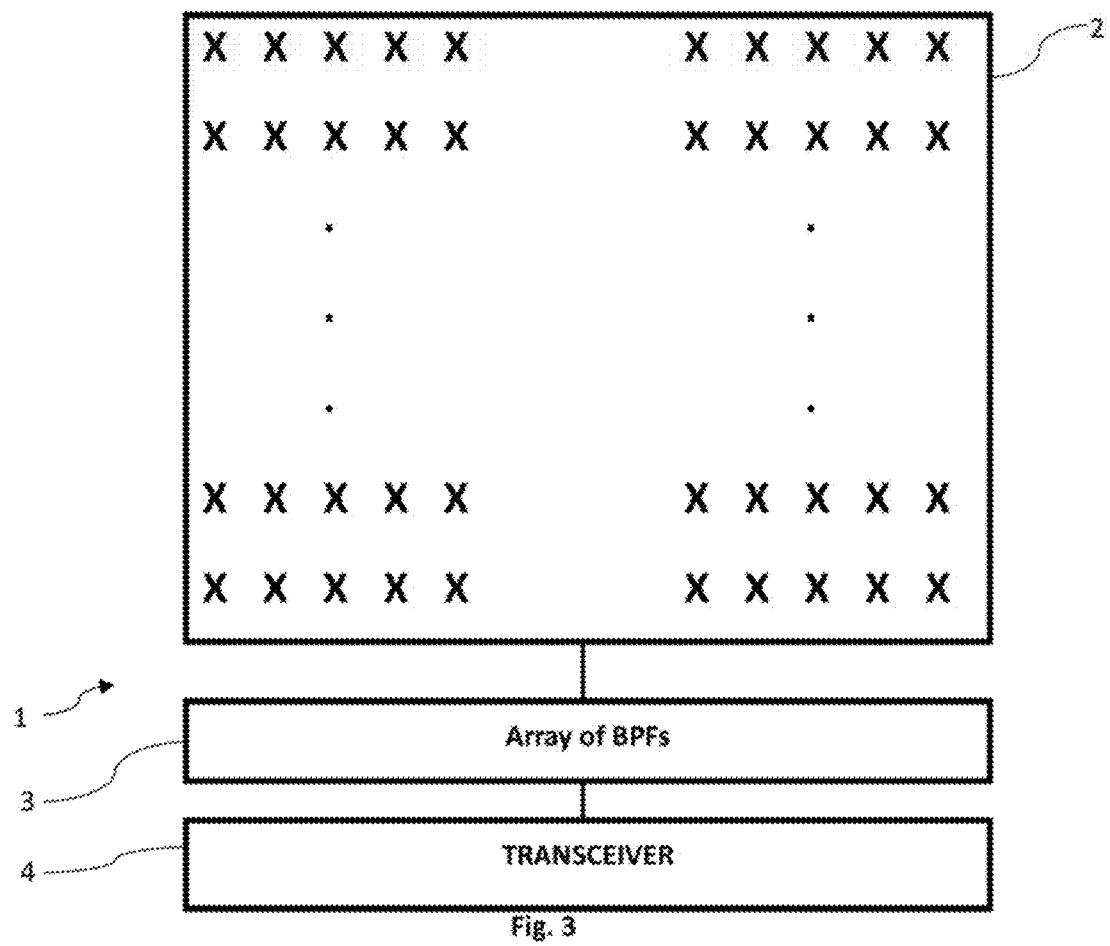
FIG. 3 is a schematic block diagram showing an integrated RE front-end system for a communications apparatus.
Figure 4:
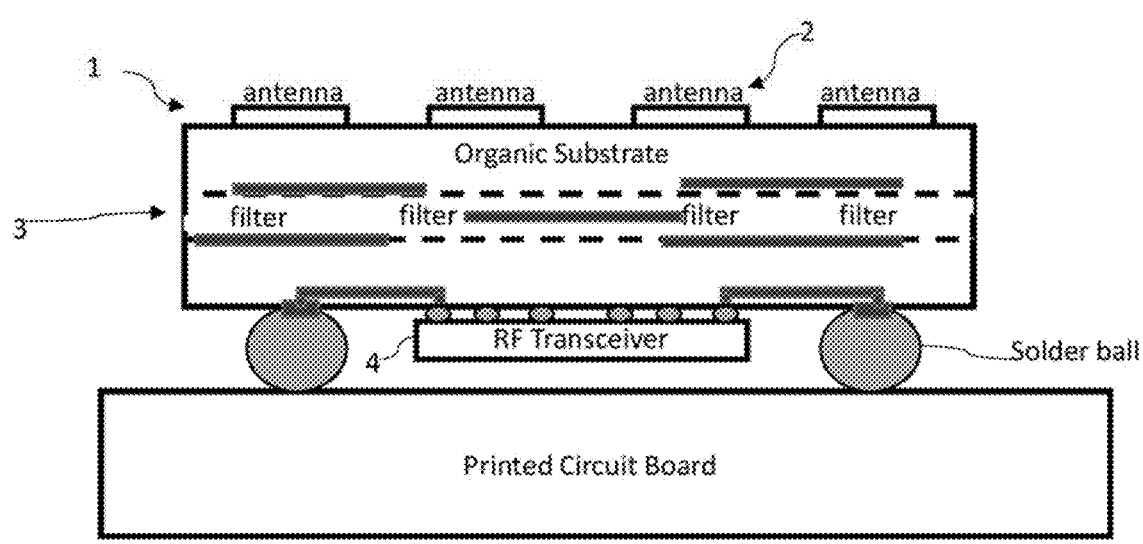
FIG. 4 is a side view of a substrate based integrated RF front-end system for a communications apparatus.

FIG. 1 shows an example of bandpass filters (BPFs) 1 in a wireless communications system in a typical communications system arrangement, FIG. 2 shows an example of the BPFs in a radio frequency (RF front-end system for a communications apparatus. In the examples of FIGS. 1 and 2, the radio receiver and radio transmitter are not integrated. In contrast, FIG. 3 shows an integrated RF front-end system 1 for a communications apparatus comprising an antenna array 2 comprising multiple antennas, each antenna denoted by "X", an array of BPFs 3 formed in a multi-layer substrate (FIG. 4), and a transceiver 4 connected to the BPF array 3. FIG. 4 is a side view of a substrate based integrated RF front-end system 1 for a communications apparatus corresponding to configuration of the RF front-end system 1 of FIG. 3. FIGS. 3 and 4 are indicative of the thrust of the present invention as more fully described below.

Figure 5:
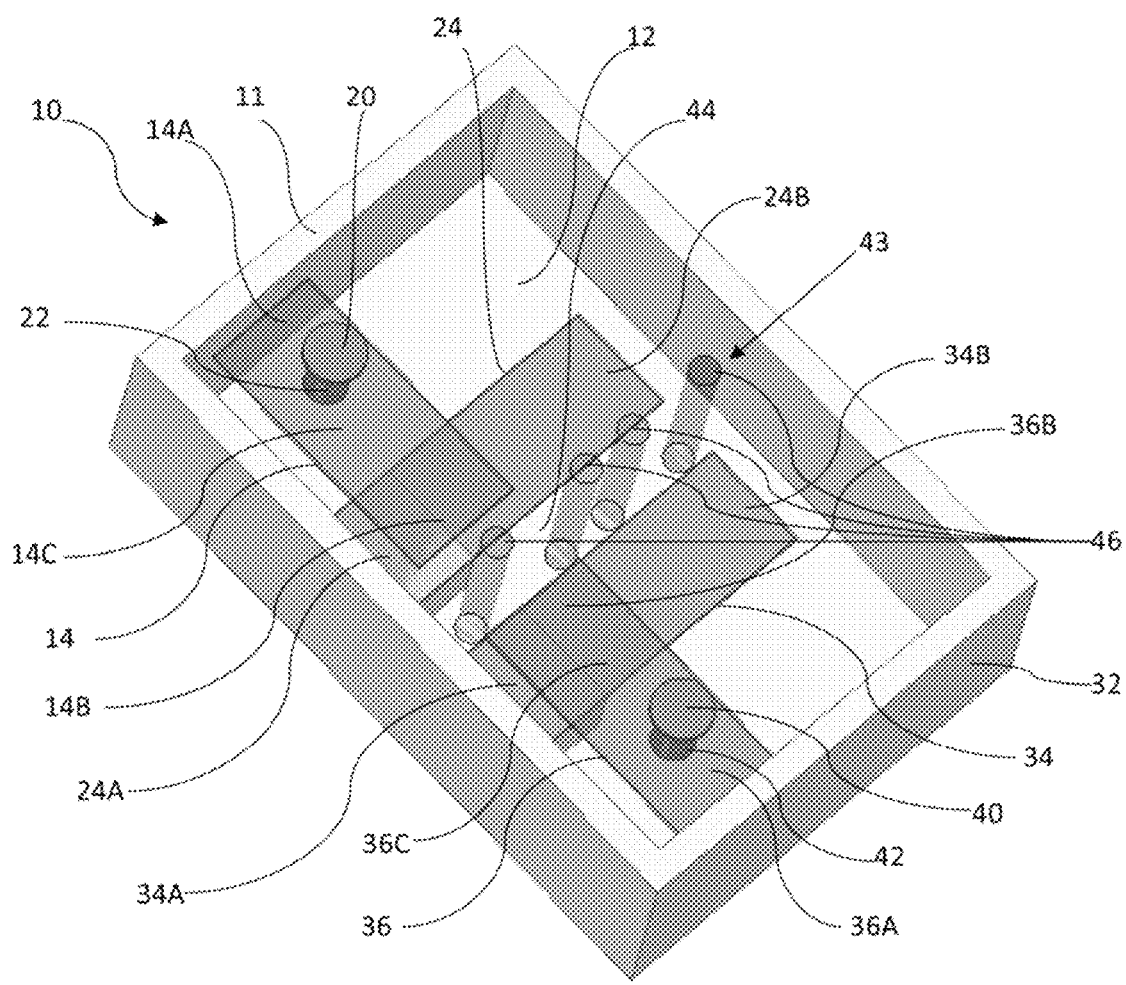
FIG. 5 is a perspective view of a multi-layer bandpass filter in accordance with a first embodiment the invention with a shield box surrounding the filter device but absent a shield cover.
Figure 6:
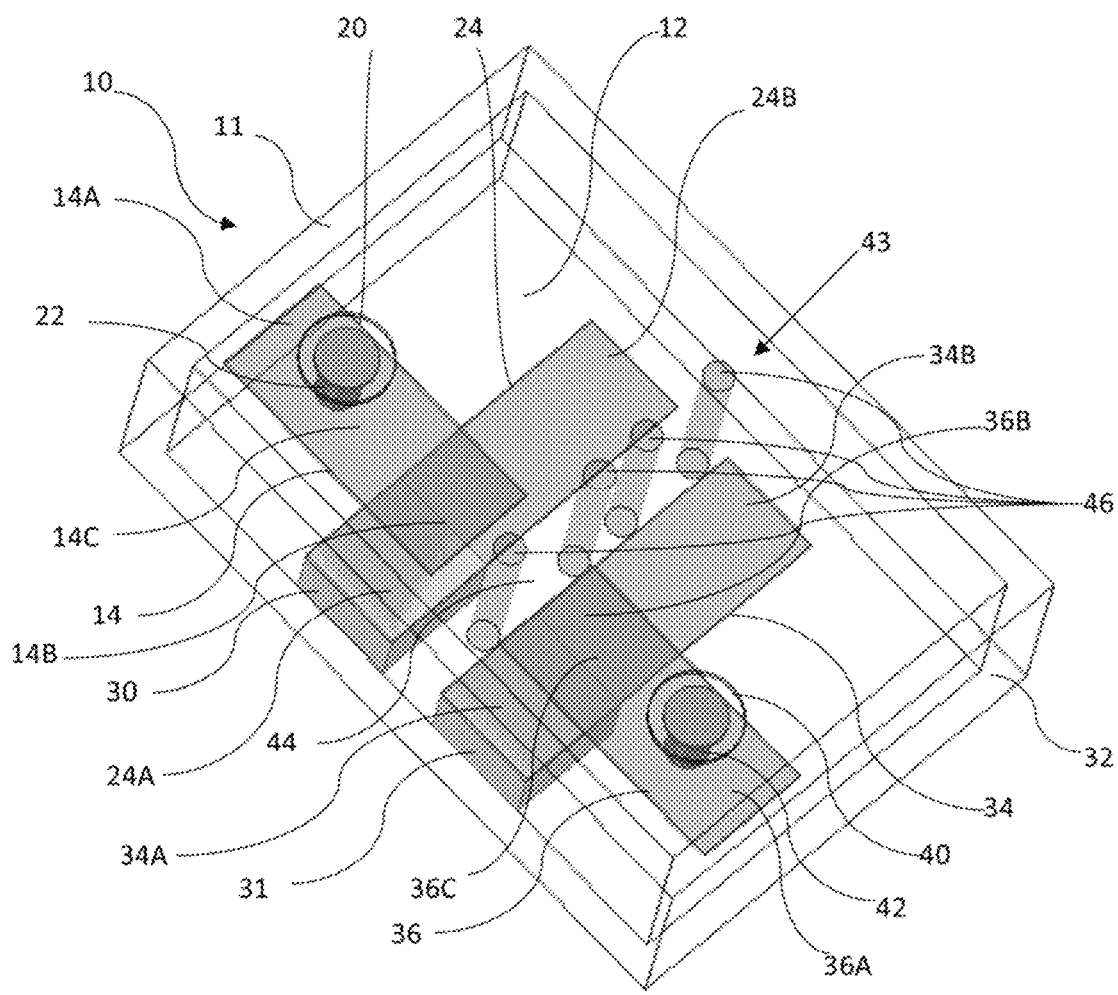
FIG. 6 is a perspective view of, the multi-layer bandpass filter of FIG. 5 with the shield box made transparent for ease of illustration.
Figure 7:
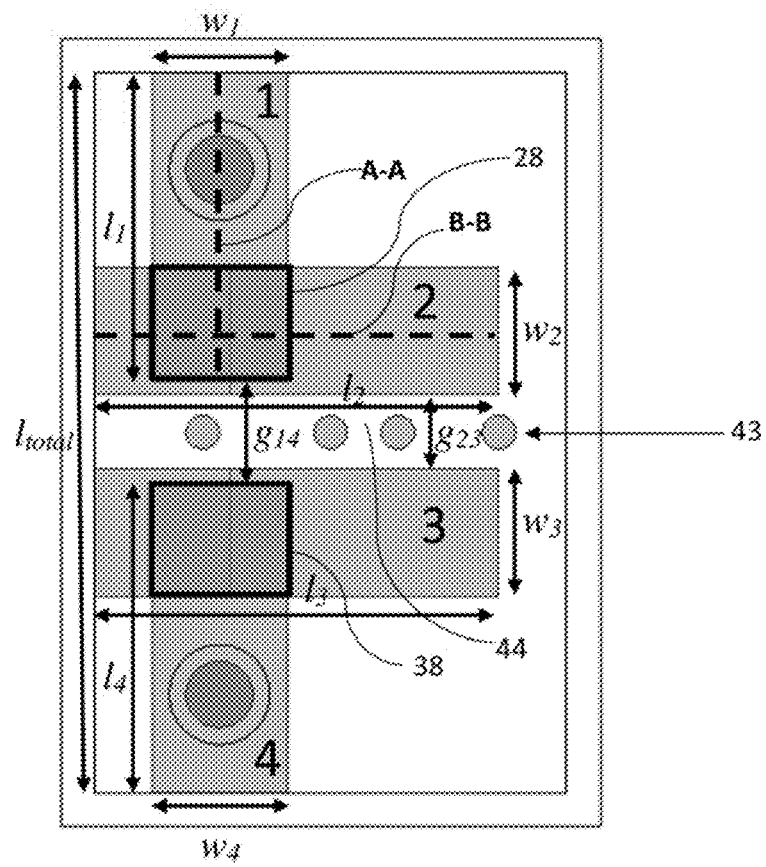
FIG. 7 is a plan view of the multi-layer bandpass filter of FIGS. 5 and 6.
Figure 8:
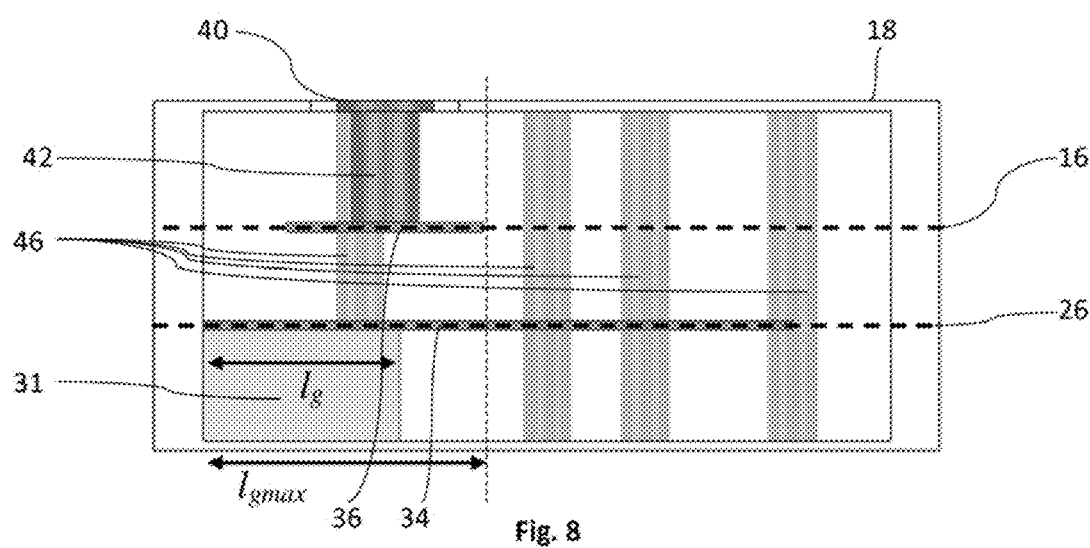
FIG. 8 is a cross-sectional side view of the multi-layer bandpass filter of FIGS. 5 and 6.

Retrying to FIGS. 5-11, shown is a first embodiment of a BPF 10 according to the invention. FIG. 5 shows the first embodiment of the BPF 10 with a shield box 11 surrounding the filter device but absent a shield cover whereas FIG. 6 shows first embodiment of the BPF 10 with the shield box 11 made transparent for ease of illustration but also absent a shield cover. The BPF 10 comprises a multi-layered substrate body 12. The multi-layered substrate body 12 preferably comprises a multi-layer laminated dielectric substrate. The BPF 10 comprises a first resonator conductor 14, denoted by "1" in FIG. 7, formed on a first layer 16 (denoted bye dashed line 16 in FIG. 8) of the body 12. As shown, the first resonator conductor 14 is preferably formed in an internal layer of the body 12 and not on its upper surface 18 (FIG. 8). The first resonator conductor 14 has a short-circuit end 14A and an open circuit end 14B. In this embodiment, the first resonator conductor 14 is elongate in form having a length $l_1$ (FIG. 7) which is greater in size than its width i.e., $l_1>w_1$. An input port 20 of the BPF 10 connects to the first resonator conductor 14. The input port 20 may be formed by a metal via 22 which extends from the upper surface 18 of the body 12 to the upper surface 14C of the first resonator conductor 14. Preferably, the input port 20 connects to the first resonator conductor 14 nearer to the short-circuit end 14A than to the open-circuit end 14B. The first resonator conductor 14 is formed as a conductive layer within the body 12 of the laminated dielectric substrate. The first resonator conductor 14 preferably comprises a metal strip.

The BPF 10 includes a second resonator conductor 24, denoted by "2" in FIG. 7, formed on a second, lower layer 26 (denoted by dashed line 26 in FIG. 8) of the body 12. The second resonator conductor 24 preferably comprises a metal strip. The second resonator conductor 24 also has a short-circuit end 24A and an open circuit end 24B. In this embodiment, the second resonator conductor 24 is also elongate in form having a length $l_2$ which is greater than its width $w_2$. The length $l_2$ and width $w_2$ of the second resonator conductor 24 may be the same or similar to the length $l_1$ and width $w_1$ of the first resonator conductor 14. The second resonator conductor 24 is spatially arranged with respect to the first resonator conductor 14 such that they comprise a first coupling area 28 formed by a partial overlap of the first resonator conductor 14 and the second resonator conductor 24. The first coupling area is denoted by solid line box 28 in FIG. 7. Also referring to FIG. 7, the second resonator conductor 24 is spatially arranged with respect to the first resonator conductor 14 such that a longitudinal axis B-B of the second resonator conductor 24 is arranged at an angle to a longitudinal axis A-A of the first resonator conductor 14. In the embodiment, the longitudinal axes A-A, B-B of the first and second resonator conductors 14, 24 are orthogonal to one another, but it will be understood that they may be set at an angle less than 90°. The preferred range of angles is 45 to 90.

By arranging the longitudinal axes A-A, B-B of the first and second resonator conductors 14, 24 at an angle to one another means that the first coupling area 28 cannot comprise a complete overlap of the first and second resonator conductors 14, 24 but can only comprise a partial overlap of their respective footprint areas. The first and second resonator conductors 14, 24 form a first resonator couple of the BPF 10.

Preferably, the length ll of the first resonator conductor 14 is in the range of $\lambda_g/3$ to $\lambda_g/5$, where $\lambda_g$. is a center wavelength of the bandpass filter passband but is preferably selected to be $\lambda_g/4$.

Preferably also, the length $l_2$ of the second resonator conductor 24 is in the range of $\lambda_g/3$ to $\lambda_g/5$ but is also preferably selected to be $\lambda_g/4$.

The second resonator conductor 24 is spatially arranged with respect to the first resonator conductor 14 such that the open-circuit end 14B of the first resonator conductor 14 is closer to the short-circuit end 24A of the second resonator conductor 24 than it is to the open-circuit end 24B of the second resonator conductor 24. The input port 20 is preferably connected to the first resonator conductor 14 at a portion of said first resonator conductor 14 which does not form part of the first coupling area 28.

As seen in FIG. 6, a grounding structure 30 may be provided in body 12 to ground the second resonator conductor 24. The grounding structure 30 may be arranged to overlap partially or fully with the first coupling area 28.

The BPF 10 may include a conductive shield wall 32 surrounding the body 12. In one embodiment, the shield wall 32 may comprise part of the shield box 11 surrounding the body 12. In another embodiment, the shield wall 32 may comprise a metallized wall surrounding the body 12. In yet another embodiment, the shield wall 32 may comprise a ring of spaced-apart metal vias formed around a perimeter of the body 12. In all cases, the shield wall will preferably include a cover and a bottom to enclose the BPF 10.

In the description of the BPF 10 as shown in FIGS. 5-11, mention has only been made so far of the first and second resonator conductors 14, 24. However, as can be seen, the BPF 10 preferably includes a third resonator conductor 34 (denoted as "3" in FIG. 7) and a fourth resonator conductor 36 (denoted as "4" in FIG. 7) which together form a second resonator couple of the BPF 10 and which preferably are formed in a mirror arrangement to the first and second resonator conductors 14, 24. The fourth resonator conductor 36 is preferably formed in the same layer 16 as the first resonator conductor 14 but spaced apart from the first resonator conductor 14, is placed in a same direction but in an opposite orientation to the first resonator conductor 14 with respect to the orientation of their respective short-circuit ends 14A, 36A and their closed-circuit ends 14B, 36B, and has length $l_4$ and width $w_4$ equal or similar to the length $l_1$ and width $w_1$ of the first resonator conductor 14. The third resonator conductor 34 is preferably formed in the same layer 26 as the second resonator conductor 24 but spaced apart from the second resonator conductor 24, placed in a same orientation, and has length $l_3$ and width $w_3$ equal or similar to the length $l_2$ and width $w_2$ of the second resonator conductor 24. As such, the third and fourth resonator conductors 34, 36 also overlap only partially to form a second coupling area 38 therebetween as shown by solid line box 38 in FIG. 7. Each of the third and fourth resonator conductors 34, 36 has a short-circuited end 34A, 36A and an open-circuit end 34B, 36B, Each of the third and fourth resonator conductors 34, 36 preferably comprise metal strips.

An output port 40 of the BPF 10 connects to the fourth resonator conductor 36. The output port 40 may be formed by a metal via 42 which extends from the upper surface 18 of the body 12 to the upper surface 36C of the fourth resonator conductor 36. Preferably, the output port 40 connects to the fourth resonator conductor 36 nearer to the short-circuit end 36A than to the open-circuit end 36B. The output port. 40 preferably connects to a portion of the fourth resonator conductor 36 which does not overlap with the second coupling area 38.

A second grounding structure 31 may be provided in body 12 to ground the third resonator conductor 34.

It is preferable that the first set of coupled resonators comprising the first and second resonator conductors 14, 24 are placed as close as possible to the second set of coupled resonators comprising the fourth and third resonator conductors 34, 36 without at least the first and fourth resonator conductors 14, 36 touching in this embodiment.

Preferably, a conductive structure 43 is provided in the body 12 in a space 44 between the first and second sets of coupled resonators. The conductive structure 43 preferably extends down through at least the layers 16, 26 of the body 12 containing the resonator conductors 14, 24, 34, 36. The conductive structure 43 may comprise a plurality of spaced-apart metal vias 46 formed down through at least the layers 16, 26 and preferably below such layers 16, 26. The metal vias 46 may be evenly spaced-apart but, in some embodiments, the spacing may be irregular. Preferably, the space 44 between the first and second sets of coupled resonators is made to be just large enough to accommodate the metal vias 46 and preferably without an contact between any of the resonator conductors 14, 24, 34, 36 and the metal vias 46.

Figure 9:
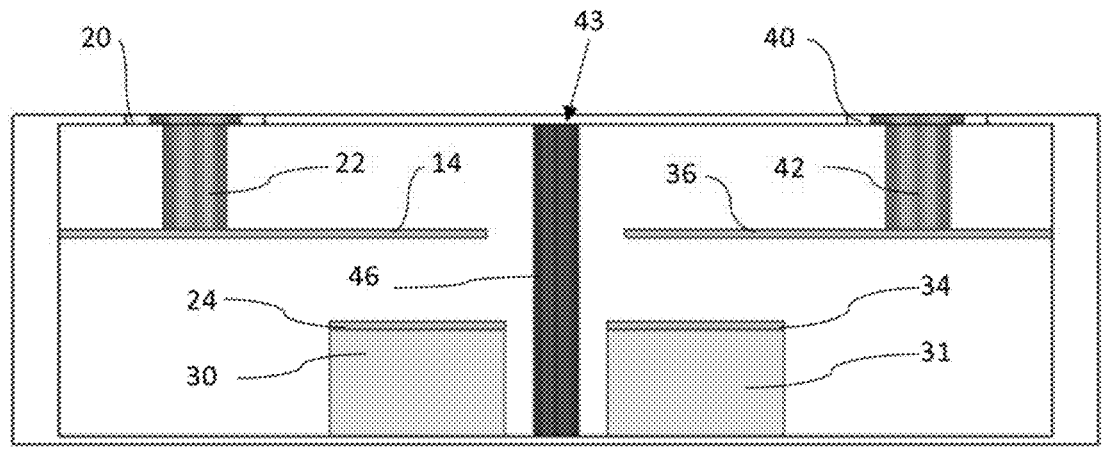
FIG. 9 is an end view of the multi-layer bandpass filter of FIGS. 5 and 6.
Figure 10:
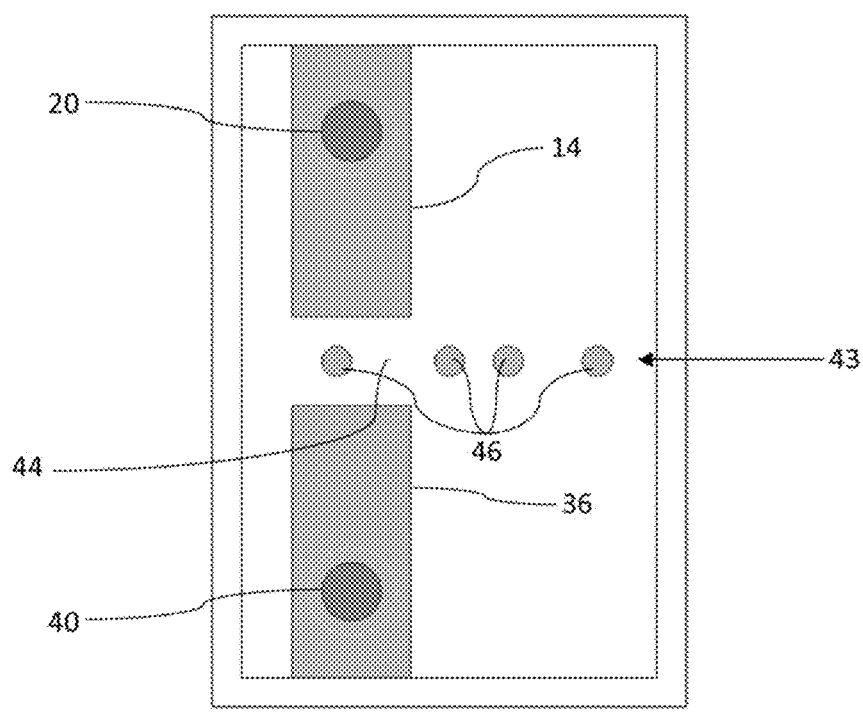
FIG. 10 is a plan view of the multi-layer bandpass filter of FIGS. 5 and 6 showing only the first and fourth resonator conductors and their relationship to the conductive structure comprising a plurality of vias.
Figure 11:
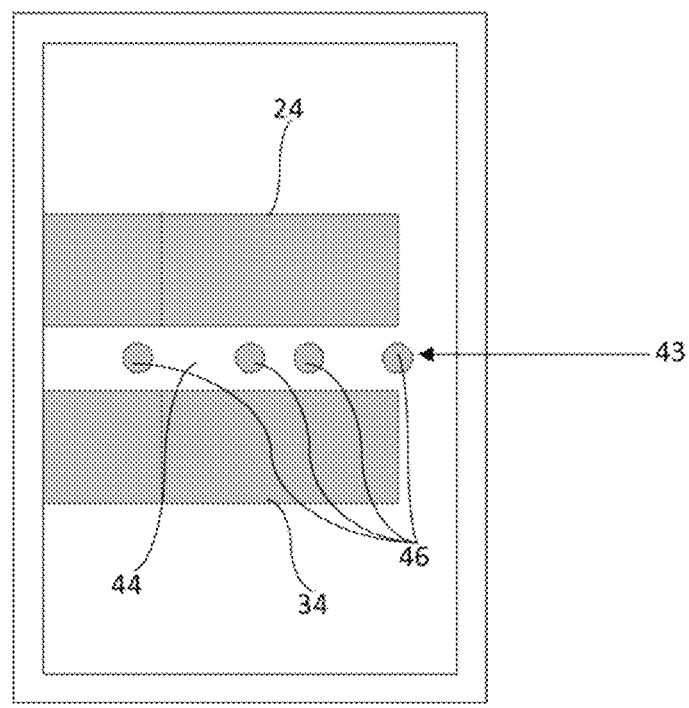
FIG. 11 is a plan view of the multi-layer bandpass filter of FIGS. 5 and 6 showing only the second and third resonator conductors and their relationship to the conductive structure comprising a plurality of vias.

FIG. 8 is a cross-sectional side view of the BPF 10 of the first embodiment showing, by way of example, that the second grounding structure 31, which comprises a metal block or a functionally equivalent array of metal vias, sits under the third resonator conductor 34 and, in this instance, partially overlaps with the second coupling area 38. Although not shown in FIG. 8, the first grounding structure 30, which also may comprise a metal block or a functionally equivalent array of metal vias, sits under the second resonator conductor 24 and partially overlaps with the first coupling area 28. FIG. 9 is an end view of the BPF 10 of the first embodiment showing both the first and second grounding structures 30, 31. FIG. 10 is a plan view of the BPF 10 of the first embodiment showing only the first and fourth resonator conductors 14, 36 and their relationship to the conductive structure 43 comprising the plurality of vias 46. FIG. 11 is a plan view of the BPF 10 of the first embodiment showing only the second and third resonator conductors 24, 34 and their relationship to the conductive structure 43 comprising the plurality of vias 46.

In the first embodiment of the BPF 10 of FIGS. 5-11, the first to fourth resonator conductors 14, 24, 34, 36 are regularly shaped.

Referring to FIGS. 12-16, shown is a second embodiment of the BPF in accordance with the invention. In the following description, like numerals will be used to denote like parts as shown in the first embodiment of FIGS. 5-11 but preceded by a "1". It should be assumed that, where no description of a part of the second embodiment is provided, such part is the same in form and or at least functionally as the same part of the first embodiment.

Figure 12:
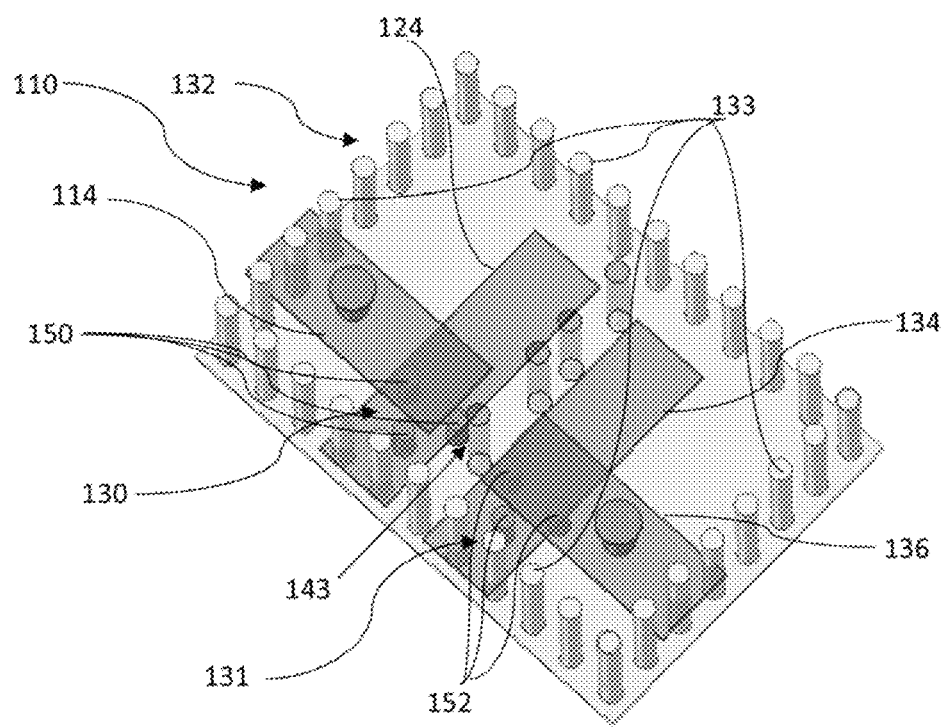
FIG. 12 is a perspective view of a multi-layer bandpass filter in accordance with a second embodiment the invention with a shield wall comprising vias surrounding the filter device but absent a shield cover.

In FIG. 12, the BFP 110 of the second embodiment differs from the first embodiment in that the shield wall 32 of the first embodiment is replaced by a shield wall 132 formed by a plurality of vias 133. Although not shown, the shield wall 132 formed by the plurality of vias 133 is completed by top and bottom shield cover members. A further difference between the first embodiment of the BPF 10 and the second embodiment of the BPF 110 is that the first and second grounding structures 30, 31 of the first embodiment are replaced respective sets of vias 150, 152. The first grounding structure 130 of the BPF 110 of the second embodiment, as shown in FIGS. 12-14 and 16, comprises a triangular array of three vias 150 arranged under at least part of the first coupling area 128. Similarly, the second grounding structure 131 of the BPF 110 of the second embodiment comprises a triangular array of three vias 152 arranged under at least part of the first coupling area 138.

Figure 13:
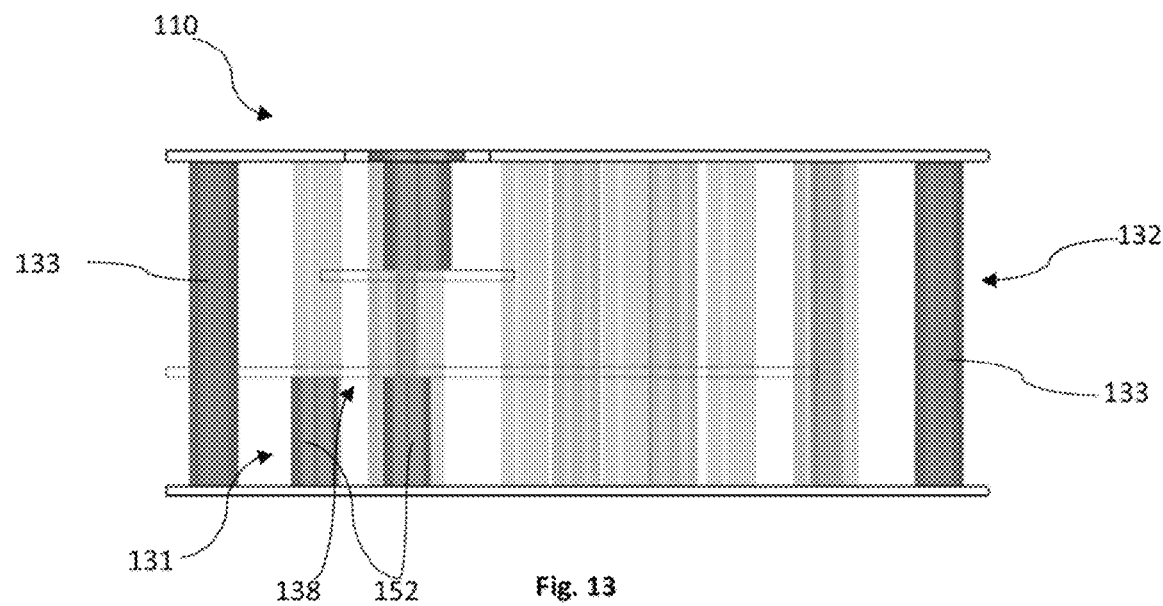
FIG. 13 is a cross-sectional side view of the multi-layer bandpass filter of FIG. 12.
Figure 14:
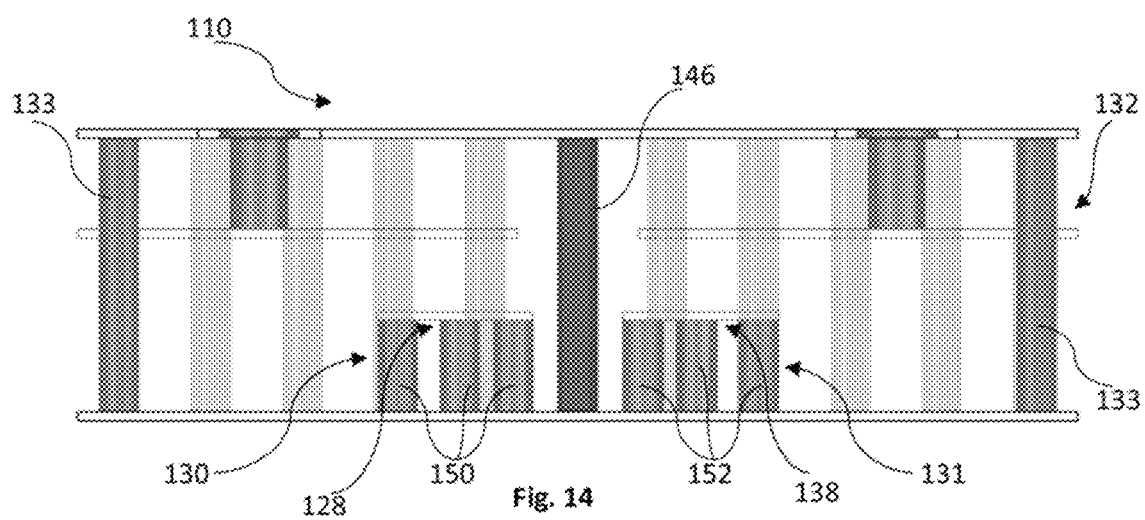
FIG. 14 is an end view of the multi-layer bandpass filter of FIG. 12.
Figure 15:
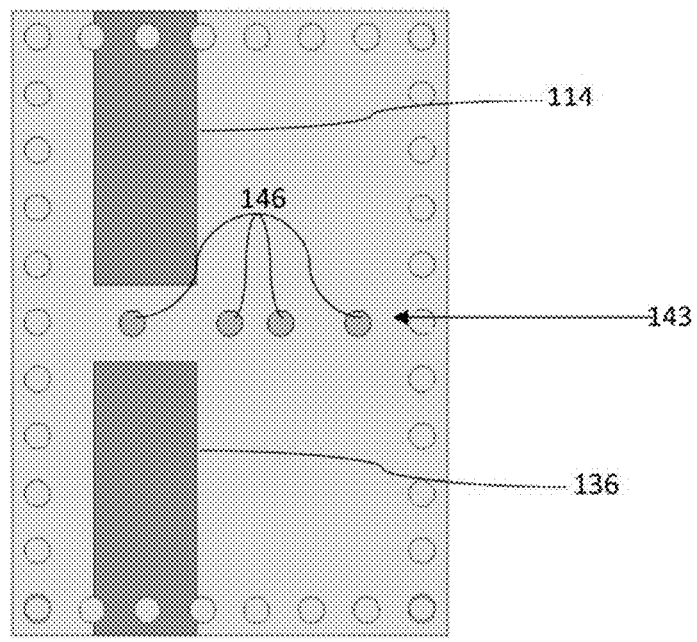
FIG. 15 is a plan view of the multi-layer bandpass filter of FIG. 12 showing only the first and fourth resonator conductors and their relationship to the conductive structure comprising a plurality of vias.
Figure 16:
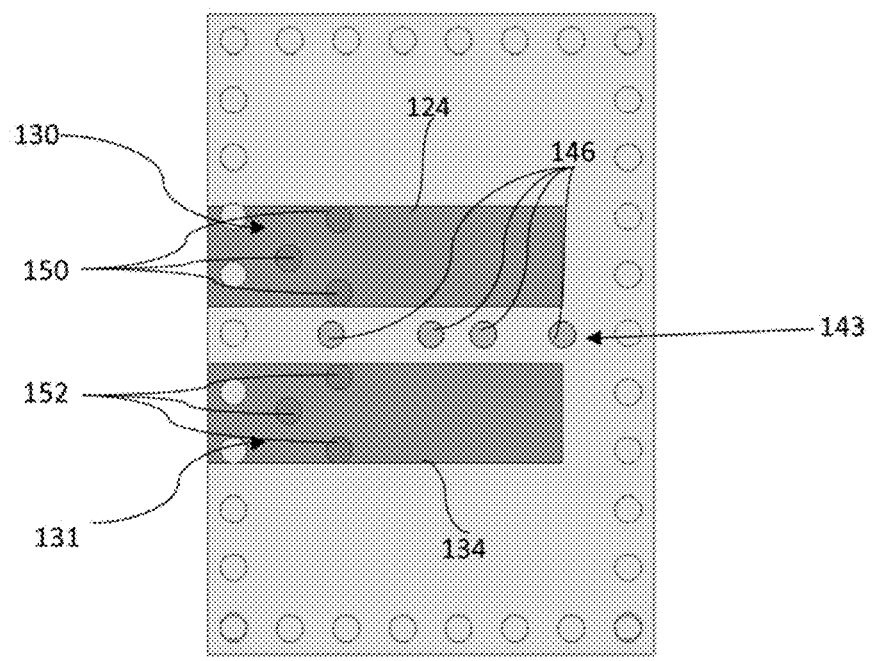
FIG. 16 is a plan view of the multi-layer bandpass filter of FIG. 12 showing only the second and third resonator conductors and their relationship to the conductive structure comprising a plurality of vias.

FIG. 13 is a cross-sectional side view of the BPF 110 of the second embodiment showing the second grounding structure 131. FIG. 14 is an end view of the of the BPF 110 of the second embodiment showing both the first and second grounding structures 130, 131 formed respectively by sets of vias 150, 152 with the set of vias 150 of the first grounding structure 130 partially overlapping with the first coupling area 128. FIG. 15 is a plan view of the BPF 110 of the second embodiment showing only the first and fourth resonator conductors 114, 136 and their relationship to the conductive structure 143 comprising the plurality of vias 146. FIG. 16 is a plan view of the BPF 110 of the second embodiment showing only the second and third resonator conductors 124, 134 and their relationship to the conductive structure 143 comprising the plurality of vias 146.

Referring to FIGS. 17-22, shown is a third embodiment of the BPF in accordance with the invention. In the following description, like numerals will be used to denote like parts as shown in the first embodiment of FIGS. 5-11 but preceded by a "2". It should be assumed that, where no description of a part of the third embodiment is provided, such part is the same in form and/or at least functionally as the same part of the first embodiment.

Figure 17:
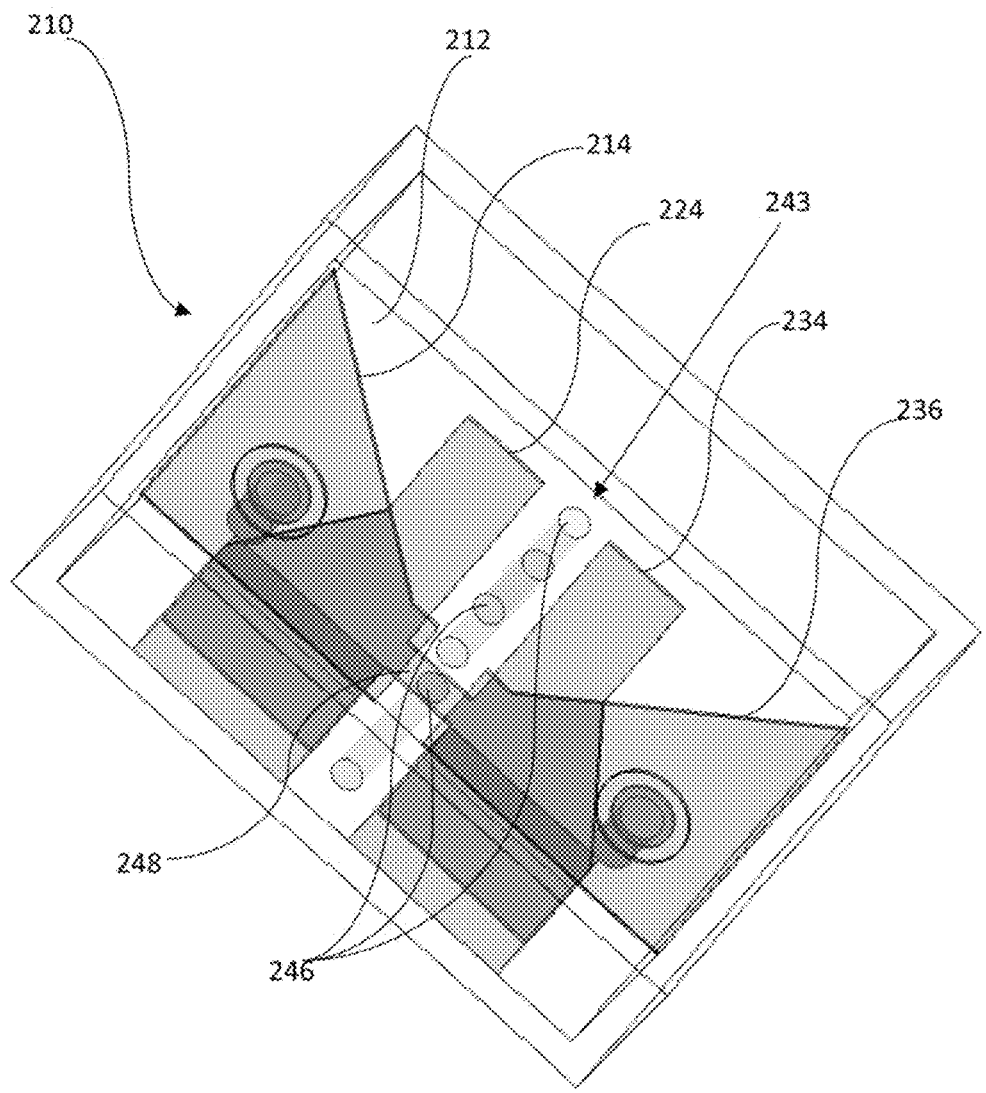
FIG. 17 is a perspective view of a multi-layer bandpass filter in accordance with a third embodiment the invention with a shield box (made transparent) surrounding the filter device but absent a shield cover.
Figure 18:
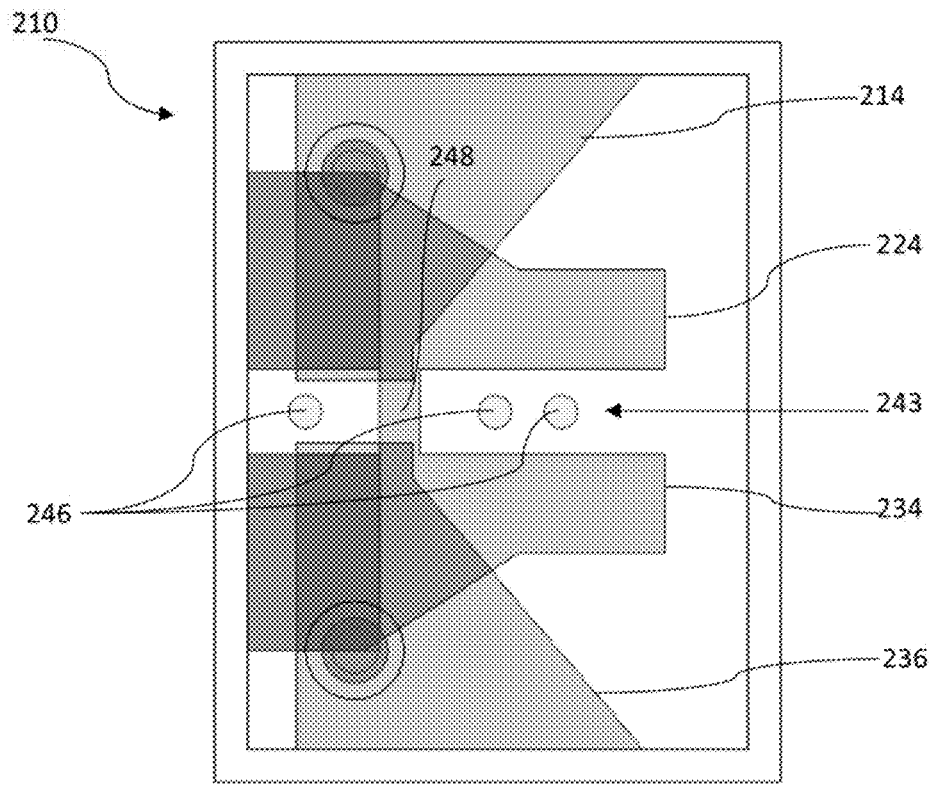
FIG. 18 is a plan view of the multi-layer bandpass filter of FIG. 17.

In FIG. 17, the BFP 210 of the third embodiment differs from the first embodiment in that the first to fourth resonator conductors 214, 224, 234, 236 are not regularly shaped but are still formed in an arrangement where the spatial overlap of the first and second resonator conductors 214, 224 cannot comprise a complete overlap but can only comprise a partial overlap. The same is true for the spatial relationship of the third and fourth resonator conductors 234, 236.

A further difference between the first embodiment of the BPF 10 and the third embodiment of the BPF 210 is that the third embodiment of the BPF 210 includes a conductive element 248 connecting the second resonator conductor 224 to the third resonator conductor 234 the conductive element 248 being preferably formed in the same layer 226 (denoted by dashed line in FIG. 19) of the multi-layer body 212 as contains the second and third resonator conductors 224, 234. The conductive element 238 is provided to electrically connect the second resonator conductor 224 to the third resonator conductor 234. The conductive element 248 passes through the conductive structure 243 comprising the plurality of vias 246 without connecting to or contacting any of said plurality of vias 246. The conductive element 248 may comprise a metal strip. The conductive element 248 increases the bandwidth of the BPF 210.

Figure 19:
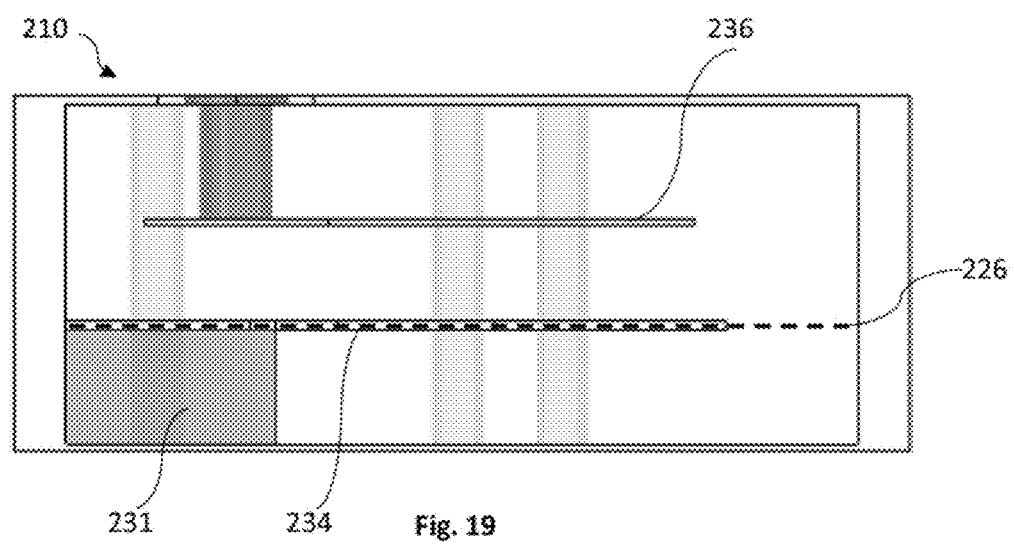
FIG. 19 is a cross-sectional side view of the multi-layer bandpass filter of FIG. 17.
Figure 20:
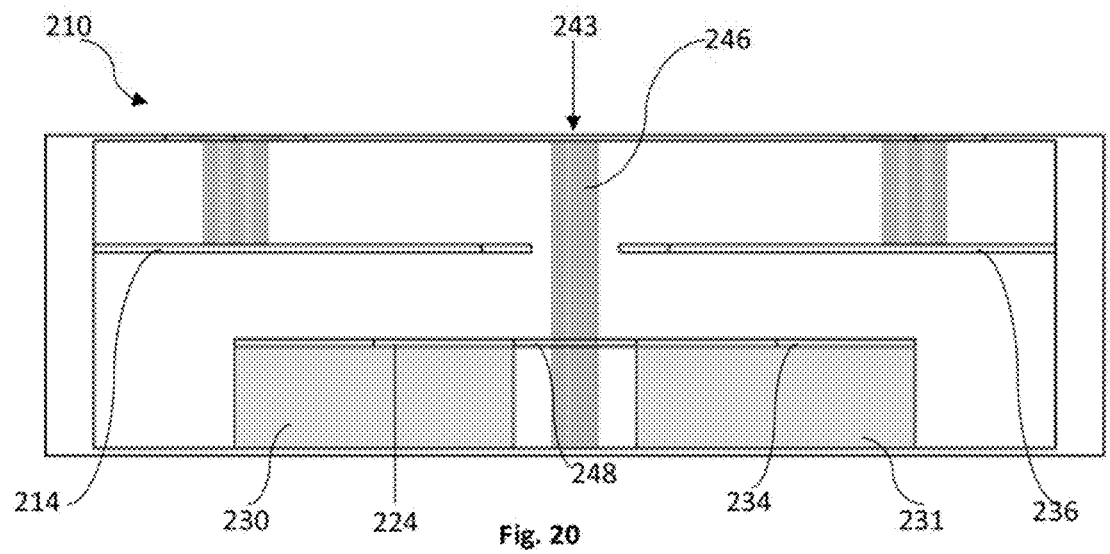
FIG. 20 is an end view of the multi-layer bandpass of FIG. 17.
Figure 21:
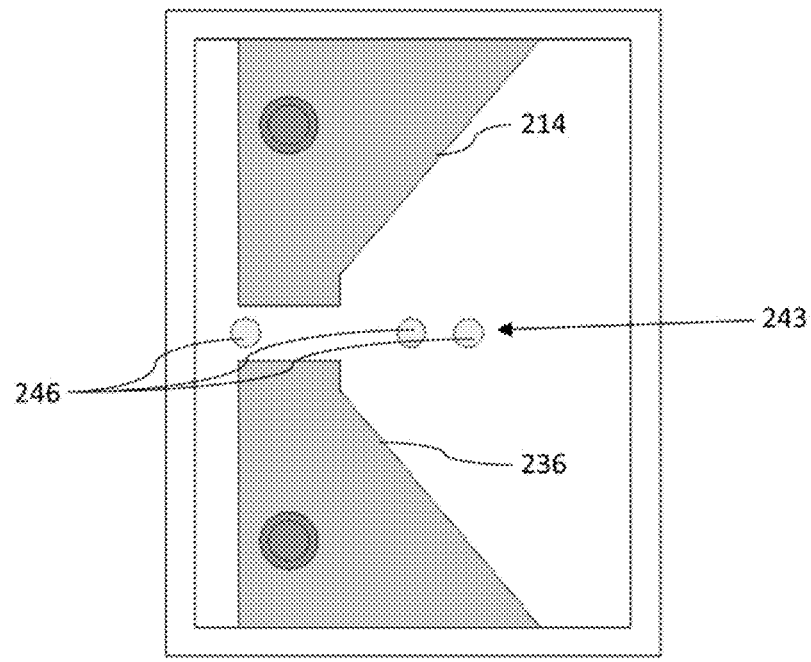
FIG. 21 is a plan view of the multi-layer bandpass filter of FIG. 17 showing only the first and fourth resonator conductors and their relationship to the conductive structure comprising a plurality of vias.
Figure 22:
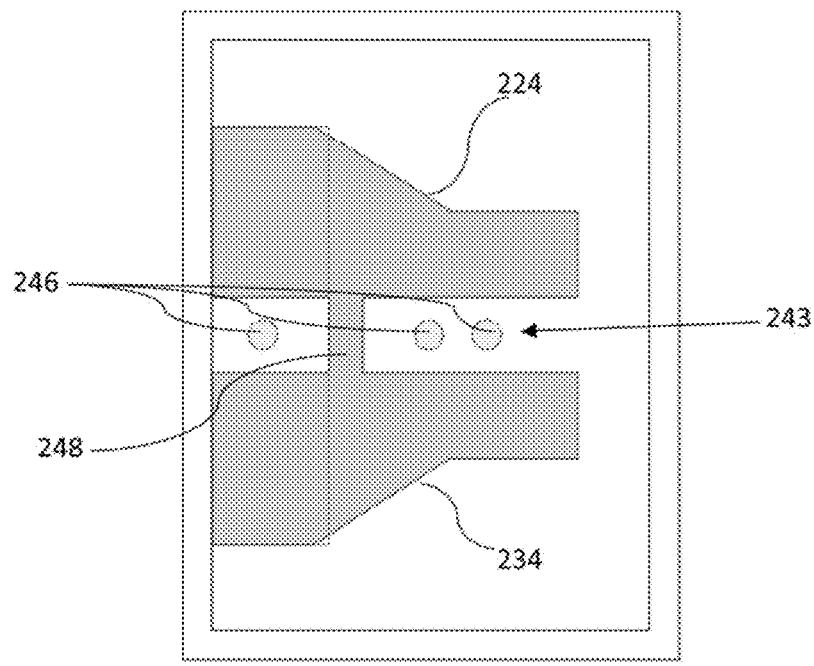
FIG. 22 is a plan view of the multi-layer bandpass filter of FIG. 17 showing only the second and third resonator conductors and their relationship to the conductive structure comprising a plurality of vias.

FIG. 19 is a cross-sectional side view of the BPF 210 of the third embodiment showing the second grounding structure 231 which lies under the third resonator conductor 234. FIG. 20 is an end view of the of the BPF 210 of the third embodiment showing both the first and second grounding structures 230, 231 each formed of a metal block or a functionally equivalent array of metal vias. FIG. 21 is a plan view of the BPF 210 of the third embodiment showing only the first and fourth resonator conductors 214, 236 and their relationship to the conductive structure 243 comprising the plurality of vias 246. FIG. 22 is a plan view of the BPF 210 of the third embodiment showing only the second and third resonator conductors 224, 234 and their relationship to the conductive structure 243 comprising the plurality of vias 246.

Referring to FIGS. 23-28, shown is a fourth embodiment of the BPF in accordance with the invention. In the following description, like numerals will be used to denote like parts as shown in the first embodiment of FIGS. 5-11 but preceded by a "3". It should be assumed that, where no description of a part of the fourth embodiment is provided, such part is the same in form and/or at least functionally as the same part of the first embodiment.

Figure 23:
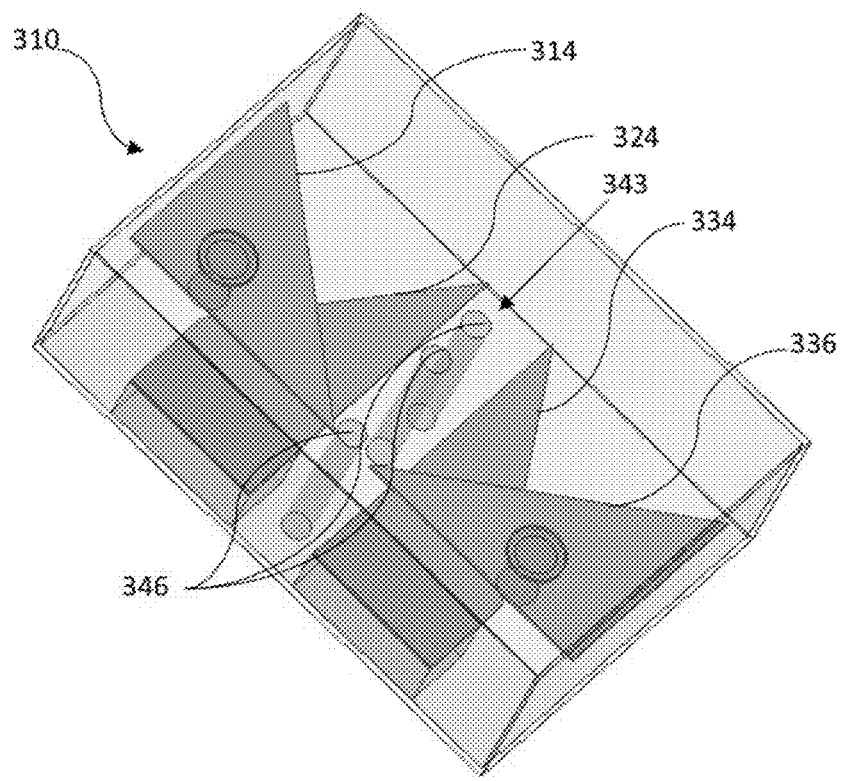
FIG. 23 is a perspective view of a multi-layer bandpass filter in accordance with a fourth embodiment the invention with a shield box made transparent) surrounding the fitter device but absent a shield cover.
Figure 24:
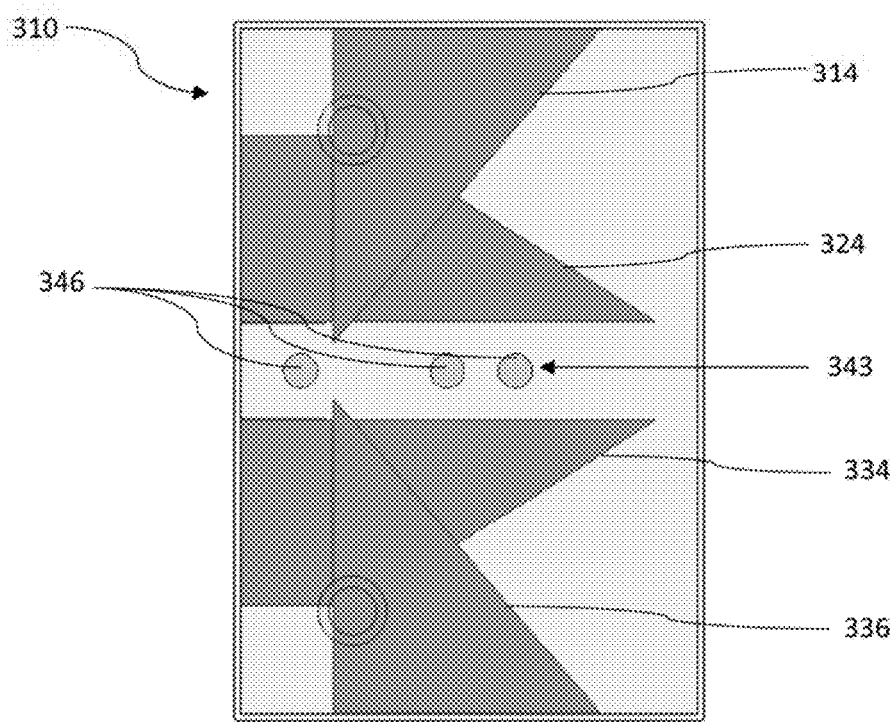
FIG. 24 is a plan view of the multi-layer bandpass filter of FIG. 23.

In FIG. 23, the BPF 310 of the fourth embodiment differs from that of the first embodiment mainly in that the shape of the first to fourth resonator conductors 314, 324, 334, 336 are triangular but are still formed in an arrangement where the spatial overlap of the first and second resonator conductors 314, 324 cannot comprise a complete overlap but can only comprise a partial overlap. The same is true for the spatial relationship of the third and fourth resonator conductors 334, 336.

Figure 25:
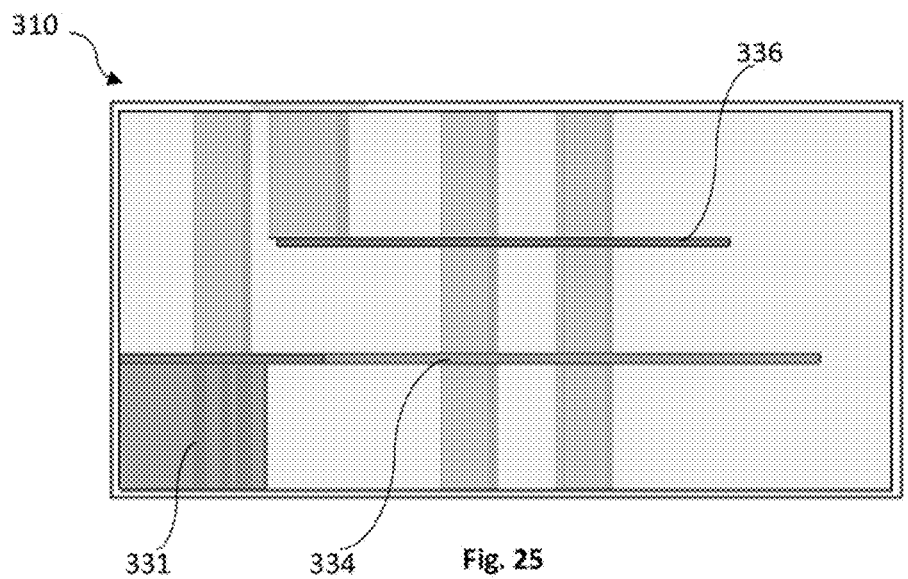
FIG. 25 is a cross-sectional side view of the multi-layer bandpass filter of FIG. 23.
Figure 26:
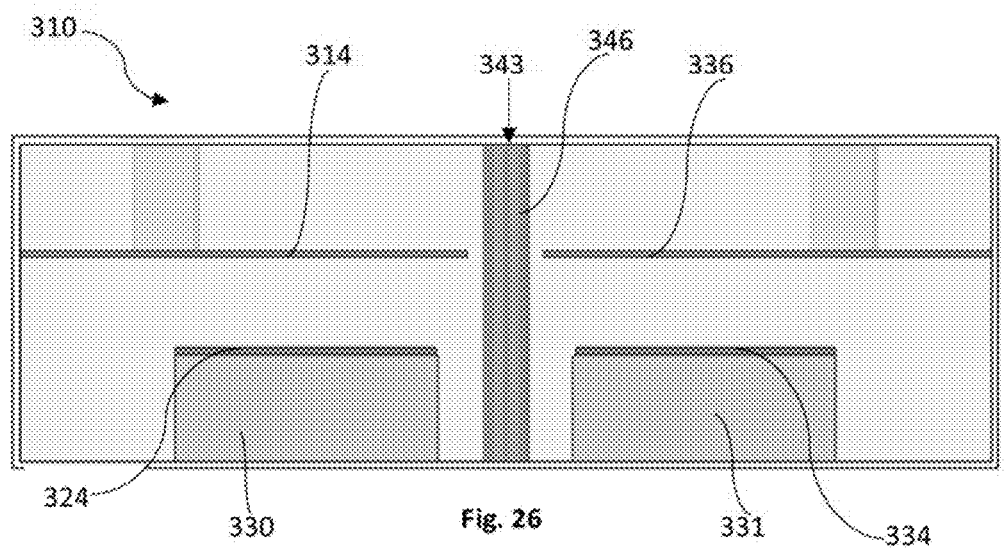
FIG. 26 is an end view of the multi-layer bandpass of FIG. 23.
Figure 27:
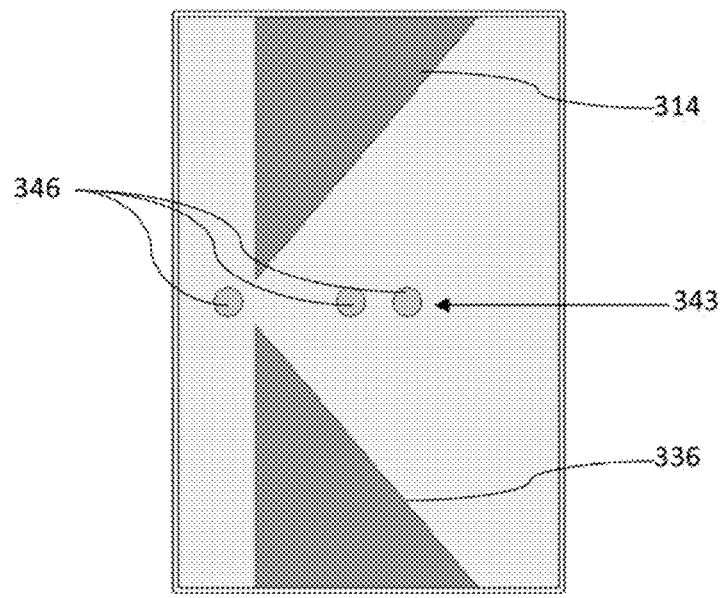
FIG. 27 is a plan view of the multi-layer bandpass filter of FIG. 23 showing only the first and fourth resonator conductors and their relationship to the conductive structure comprising a plurality of vias.
Figure 28:
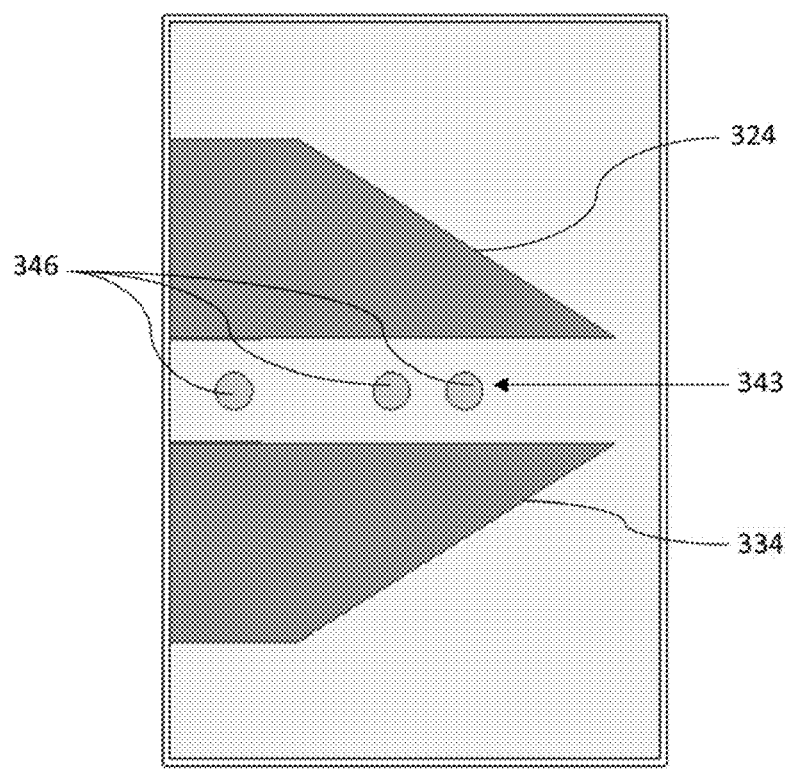
FIG. 28 is a plan view of the multi-layer bandpass filter of FIG. 23 showing only the second and third resonator conductors and their relationship to the conductive structure comprising a plurality of vias.

FIG. 25 is a cross-sectional side view of the BPF 310 of the fourth embodiment showing the second grounding structure 311 which lies under the third resonator conductor 334. FIG. 26 is an end view of the of the BPF 310 of the fourth embodiment showing both the first and second grounding structures 330, 131 each formed of a metal block or a functionally equivalent array of metal vias. FIG. 27 is a plan view of the BPF 310 of the fourth embodiment showing only the first and fourth resonator conductors 314, 336 and their relationship to the conductive structure 343 comprising the plurality of vias 346. FIG. 28 is a plan view of the BPF 310 of the fourth embodiment showing only the second and third resonator conductors 324, 334 and their relationship to the conductive structure 343 comprising the plurality of vias 346.

Generally speaking, the larger the energy coupling strength between resonators such as between the first resonator conductor 14, 114, 214, 314 and the second resonator conductor 24, 124, 224, 324 leads to a larger bandwidth of the BPF 10, 110, 210, 310. Usually, the larger the coupling areas between coupled resonators means stronger energy, coupling between them and therefore a larger BPF bandwidth. The effective coupling area is therefore positively correlated with the bandwidth.

Referring to FIG. 7 by way of example, the width $w_1$ of the first resonator conductor 14 and the width $w_2$ of the second resonator conductor 24 define for this embodiment a maximum size of the first coupling area 28, i.e., a maximum size of $w_1*w_2$. If the space 44 between the first and second sets of coupled resonators is defined as $g_{23}$, the distance between the open circuit ends 14B, 36B of the first and fourth resonator conductors 14, 36 is defined as $g_{14}$, and the open circuit ends 14B, 36B of the first and fourth resonator conductors 14, 36 should not, by design, extend into the space 44, then the size of the first coupling area 28 is related to $g_{14}$. Where $g_{14}$ is larger than $g_{23}$, then the size of the first coupling area 28 has a size $<w_1*w_2$. When $g_{14} \leq g_{23}$, then the size of the first coupling area 28 is 100% of $w_1*w_2$. When $g_{14} > g_{23}$, then the size of the first coupling area 28 is less than 100% of $w_1*w_2$. The same relationship is true for the size of the second coupling area 38 and $w_3$ and $w_4$.

Where $l_{total}$ is the overall length of the BPF 10 and assuming that the lengths $l_1$, $l_4$ of the first and fourth resonator conductors 14, 36 are fixed, then the total length $l_{total}$ of the BPF body 12 is given as:

$$l_{total} = l_1 + l_4 + g_{14}.$$

It is desirable therefore to keep $g_{14}$ as small as possible. Both $g_{14}$ and $g_{23}$ are preferably larger than the diameter of vias 46 and leave extra space to meet machining requirements. However, in some embodiments, $g_{14}$ may be smaller than $g_{23}$ ($g_{14} < g_{23}$) which is indeed the case in the third embodiment of FIGS. 17-22 which has an increased size of $g_{23}$ and includes the conductive element 248 connecting the second resonator conductor 224 to the third resonator conductor 234.

According to the principle of BPF design, the coupling strength between the first and fourth resonator conductors 14, 36 is much weaker than coupling strength between the second and third resonator conductors 24, 34. Larger distance corresponds to weaker coupling. Therefore, preferably, $g_{14} \geq g_{23}$. Subject to the constraint that the open circuit ends 14B, 36B of the first and fourth resonator conductors 14, 36 cannot or should not extend into the space 44 having size $g_{23}$, then the nearer the size of the first coupling area 28 to its maximum size defined by $w_1*w_2$. The same is true of the second coupling area 38. It is preferred that the size of each of the first and second coupling areas 28, 38 is within the range of 50% to 100% of their maximum sizes and preferably at or above 80%. In other words, the first coupling area 28 has a size that is preferably at least 80% of $w_1*w_2$ and the second coupling area 38 has a size that is preferably at least 80% of $w_3*w_4$.

The conductive structure 43 comprising the plurality of vias 46 controls the coupling strength between at least the first resonator conductor 14 and the fourth resonator conductor 36. The strength of coupling between the first resonator conductor 14 and the fourth resonator conductor 36 is most affected by the vias 46 closest to the first resonator conductor 14 and the fourth resonator conductor 36 and/or by the spacing of the vias 46. Furthermore, the conductive structure 43 comprising the plurality of vias 46 controls the coupling strength between the second resonator conductor 24 and the third resonator conductor 34. All of the vias 46 have an effect on the coupling strength between the second resonator conductor 24 and the third resonator conductor 34. As already indicated $g_{14}$ and $g_{23}$ must be larger than the diameters of the conductive vias 46.

Whilst BPFs 10, 110, 210, 310 of the invention are intended to provide millimeter-wave PRFs for use in 5G communications applications, the BPFs are not limited to such applications but have broader applicability in, for example System on Chip (SoC) applications and Internet of Things (IoT) applications.

Referring to FIG. 8 by way of example, it is noted that millimeter-wave BPFs for 5G communication applications are narrow-band. One way to realize this is to reduce the size of the first and second coupling areas 28, 38 by making FIG. 7) larger. However, as seen in FIG. 7, making $g_{14}$ larger increases the length of the BPF 10 and thus increases its footprint area. An alternative way of adjusting the BPF bandwidth is to use the first grounding structure 30 (FIG. 9) located in contact with and under the second resonator conductor 24 to reduce the coupling strength between the first resonator conductor 14 and the second resonator conductor 24. Similarly, the second grounding structure 31 connecting to and located under the third resonator conductor 34 can be used to reduce the coupling strength between the fourth resonator conductor 36 and the third resonator conductor 34. The first and second grounding structures 30, 31 each preferably comprises a metal block or a functionally equivalent array of metal vias.

As seen in FIG. 8, the second grounding structure 31 has a length $l_g$ which, as shown, partially overlaps with the second coupling area 38 (FIG. 71. The first grounding structure 30 also has a length $l_g$ which partially overlaps with the first coupling area 28 (FIG. 7). Each of the first and second grounding structures 30, 31 could have a maximum length $l_{gmax}$ by which such structures 30, 31 fully overlap with their respective coupling areas 28, 38. Where $l_g < l_{gmax}$, a part of each coupling area 28, 38 is not overlapped by its grounding structure 30, 31. The non-overlapped portions of the first and second coupling areas not overlapped respectively by the first and second grounding structures 30, 31 provide the effective coupling areas of the first and second coupling areas 28, 38. In other words, those parts of the first and second coupling areas 28, 38 which are overlapped respectively by the first and second grounding structures 30, 31 do not provide effective coupling due to the grounding of such overlapped portions of the first and second coupling areas 28, 38 by the grounding structures 30, 31.

The overlapped grounded portions of the first and second coupling areas 28, 38 do not provide energy coupling. For example, the grounded part of the second resonator conductor 24 does not have energy coupling over all of the first coupling area 28. As $l_g$ increases, the grounded portion of the second resonator conductor 24 becomes larger and the effective coupling area between the first resonator conductor 14 and the second resonator conductor 24 becomes smaller. The area of the first coupling area 28 that is effective for coupling becomes smaller. Consequently, the bandwidth of the BPF 10 narrows and the resonant, frequency increases.

It will be understood therefore that it is possible to keep $g_{14}$ as small as allowed under the afore-described design constraints in order to keep $l_{total}$ as small as possible and yet reduce the coupling strength of the first and second coupling areas 28, 38 in order to adjust the BPF bandwidth and or resonant frequency. Furthermore, where the BPF 10 requires a very narrow bandwidth, it is possible to use a combination of the overlapping grounding structures 30, 31 to increase the amount of overlapping with the first and second coupling areas 28, 38 and to increase the size of $g_{14}$. Whilst this would increase $l_{total}$ above its minimum size, it would still be possible to make the BPF 10 more compact than known BPFs by placing a limit of how large $g_{14}$ can be made. In this case, it is preferred that $g_{14}$ should not be made so large as to reduce the size of the first coupling area 28 to less than 50% $w_1*w_2$ with the same limit applying to the second coupling area 38, i.e., that $g_{14}$ should not be made so large as to reduce the size of the second coupling area 38 to less than 50% $w_3*w_4$.

The invention also provides an RF from-end system for a communications apparatus including a BPF according to the invention.

The invention also provides a method of forming a bandpass filter according to the invention, the method comprising the steps of: forming a first resonator conductor on a first layer of the multi-layered body; forming a second resonator conductor on a second, lower layer of the multi-layered body such that the first resonator conductor and the second resonator conductor have a first coupling area comprising at least a partial overlap of the first resonator conductor and the second resonator conductor; and such that a length of each said resonator conductor is in the range of $\lambda_g/13$ to $\lambda_g/5$, where $\lambda_g$. is a center wavelength of the bandpass filter passband.

The present invention provides an RF front-end apparatus with BPFs that have excellent performance including low insertion loss, compact size, and excellent shielding.

The present invention provides a millimeter-wave BPF having a plurality of resonators and a shield for use in 5G applications.

The present invention achieves the foregoing advantages not least because: the laminated substrate resonator conductors have a smaller footprint area than resonator conductors arranged in a monolayer; the wavelength resonators have a smaller area and or wider stopband than ½ wavelength resonators: provides a large bandwidth range for the BPF; and provides a wider stopband by adding a conductive structure such as plurality of aligned metal vias.

The lowest parasitic resonant frequency of a ¼ wavelength resonator is three times the center frequency of the passband of the PBF whereas, for a ½ wavelength resonator, lowest parasitic resonant frequency is two times the center frequency of the passband of the PBF. A smaller waveguide leads to a higher parasitic frequency. Therefore, as a ¼ wavelength resonator has a smaller area than a ½ wavelength resonator, using wavelength resonators leads to a higher parasitic frequency. ¼ wavelength resonators also have a wider stopband than ½ wavelength resonators.

The shield 32 and the dielectric material inside the shield 32 constitute a structure similar to a waveguide. The waveguide mode produces unwanted resonance having a resonance frequency in a frequency region above the passband thus degrading the attenuation characteristic in the frequency region above the passband. The resonance frequency of the lowest-order wave aide mode varies depending on the shape of the space defined by the shield 32. Typically, the larger the space, the lower the resonance frequency of the lowest-order waveguide mode. The conductive structure 43 comprising the plurality of metal vias 46 provides a large frequency gap between the parasitic resonance and the passband.

In the embodiments of the present invention, the first to fourth resonator conductors may have shapes such as rectangles, trapezoids, triangles or any combination of the foregoing.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

In the claims which follow and in the preceding description of the invention, except where the context requires otherwise due to express language or necessary implication, the word "comprise" or variations such as "comprises" or "comprising" is used in an inclusive sense, i.e., to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art.

The invention claimed is:

1. A bandpass filter comprising:
a multi-layered body;
a first resonator conductor formed on a first layer of the body;
a second resonator conductor formed on a second, lower layer of the body;
wherein the first resonator conductor and the second resonator conductor comprise a first coupling area formed by a partial overlap of the first resonator conductor and the second resonator conductor;
wherein a length of each said resonator conductor is in the range of $\lambda_g/3$ to $\lambda_g/5$, where $\lambda_g$. is a center wavelength of the bandpass filter passband; and
wherein a longitudinal axis of the first resonator conductor is formed to intersect a longitudinal axis of the second resonator conductor at an angle.

2. The bandpass filter of claim 1, wherein the first layer comprises an internal layer of the multi-layer body below an upper surface of said multi-layer body.

3. The bandpass filter of claim 1, wherein the length of each said resonator conductor is $\lambda_g/4$.

4. The bandpass filter of claim 1, wherein the multi-layered body comprises a laminated dielectric multi-layered substrate.

5. The bandpass filter of claim 1, wherein each said resonator conductor has a short-circuit end and an open-circuit end; and wherein the open-circuit end of the first resonator conductor is closer to the short-circuit end of the second resonator conductor than said open-circuit end of the first resonator conductor is to the open-circuit end of the second resonator conductor.

6. The bandpass filter of claim 1, wherein the bandpass filter has a conductive shield surrounding the multi-layered body.

7. The bandpass filter of claim 1, wherein the bandpass filter is a millimeter (mm) wave bandpass filter.

8. The bandpass filter of claim 1, wherein the angle of intersection of the longitudinal axis of the first resonator conductor with the longitudinal axis of the second resonator conductor is in the range of 45° to 90°.

9. The bandpass filter of claim 1, wherein a grounding structure is provided in the multi-layer body to ground the second resonator conductor, the grounding structure being arranged to overlap partially or fully with the first coupling area between the first and second resonator conductors.

10. The bandpass filter of claim 1, wherein the bandpass filter comprises:
   a third resonator conductor formed on said first layer of the body;
   a fourth resonator conductor formed on said second, lower layer of the body;
   wherein the third resonator conductor and the fourth resonator conductor are spaced apart from said first resonator conductor and said second resonator conductor;
   wherein the third resonator conductor and the fourth resonator conductor comprise a second coupling area formed by a partial overlap of the third resonator conductor and the fourth resonator conductor; and
   wherein a length of each said resonator conductor is in the range of $\lambda_g/3$ to $\lambda_g/5$.

11. The bandpass filter of claim 10, wherein said partially overlapped third resonator conductor and fourth resonator conductor are arranged in a mirror configuration to a configuration of the first resonator conductor and the second resonator conductor.

12. The bandpass filter of claim 10, wherein an input port of the bandpass filter connects to a portion of the first resonator conductor which does not overlap with the second resonator conductor and an output port of the bandpass filter connects to a portion of the fourth resonator conductor which does not overlap with the third resonator conductor.

13. The bandpass filter of claim 10, wherein a conductive structure is provided in the multi-layer body in a space between the configuration comprising said first and second resonator conductors and the configurations comprising said third and fourth resonator conductors, where the conductive structure extends down through at least the layers of the multi-layer body containing the resonator conductors.

14. The bandpass filter of claim 13, wherein the conductive structure comprises a plurality of metal vias formed down through at least the layers of the multi-layer body containing the resonator conductors.

15. The bandpass filter of claim 13, wherein a size of the space between the configuration comprising said first and second resonator conductors and the configurations comprising said third and fourth resonator conductors is made to be just large enough to accommodate the conductive structure without contact between any of the resonator conductors and the conductive structure.

16. The bandpass filter of claim 10, wherein a conductive element is provided to connect the second resonator conductor to the third resonator conductor, said conductive element being formed in the same layer of the multi-layer body as contains the second and third resonator conductors.

17. The bandpass filter of claim 13, wherein a conductive element is provided to connect the second resonator conductor to the third resonator conductor, said conductive element being formed in the same layer of the multi-layer body as contains the second and third resonator conductors, and wherein said conductive element passes through said conductive structure without connecting to said conductive structure.

18. A method for forming a bandpass filter having a multi-layered body, the method comprising the steps of:
   forming a first resonator conductor on a first layer of the multi-layered body;
   forming a second resonator conductor on a second, lower layer of the multi-layered body such that the first resonator conductor and the second resonator conductor have a first coupling area comprising a partial overlap of the first resonator conductor and the second resonator conductor; and such that a length of each said resonator conductor is in the range of $\lambda_g/3$ to $\lambda_g/5$, where $\lambda_g$ is a center wavelength of the bandpass filter passband; and such that a longitudinal axis of the first resonator conductor is formed to intersect a longitudinal axis of the second resonator conductor at an angle.

19. A radio frequency (RF) front-end system for a communications apparatus including a bandpass filter comprising:
   a multi-layered body;
   a first resonator conductor formed on a first layer of the body;
   a second resonator conductor formed on a second, lower layer of the body;
   wherein the first resonator conductor and the second resonator conductor comprise a first coupling area formed by a partial overlap of the first resonator conductor and the second resonator conductor;
   wherein a length of each said resonator conductor is in the range of $\lambda_g/3$ to $\lambda_g/5$, where $\lambda_g$ is a center wavelength of the bandpass filter passband; and
   wherein a longitudinal axis of the first resonator conductor is formed to intersect a longitudinal axis of the second resonator conductor at an angle.

* * * * *